US009897681B2

(12) United States Patent
Plaumann et al.

(10) Patent No.: US 9,897,681 B2
(45) Date of Patent: Feb. 20, 2018

(54) CALIBRATION METHOD AND CALIBRATION ARRANGEMENT

(71) Applicant: Rohde & Schwarz GmbH & Co. KG, Munich (DE)

(72) Inventors: Ralf Plaumann, Forstern (DE); Thomas Lutz, Munich (DE); Jens Volkmann, Birnbach (DE); Franz Obermayr, Kirchdorf an der Amper (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 396 days.

(21) Appl. No.: 14/635,698

(22) Filed: Mar. 2, 2015

(65) Prior Publication Data

US 2016/0259025 A1  Sep. 8, 2016

(51) Int. Cl.
*G01R 35/00* (2006.01)
*G01R 31/319* (2006.01)
*G01R 27/28* (2006.01)

(52) U.S. Cl.
CPC .......... *G01R 35/005* (2013.01); *G01R 27/28* (2013.01); *G01R 31/3191* (2013.01)

(58) Field of Classification Search
CPC ...... G01R 35/00; G01R 35/005; G01R 27/00; G01R 27/28; G01R 27/32; G01R 31/3191; G01R 31/2822
See application file for complete search history.

(56) References Cited

U.S. PATENT DOCUMENTS

| 7,519,509 | B2* | 4/2009 | Nakayama | G01R 27/28 324/601 |
| 2006/0241887 | A1* | 10/2006 | Sakayori | G01R 35/005 702/117 |
| 2010/0204941 | A1* | 8/2010 | Heuermann | G01R 35/005 702/85 |

(Continued)

FOREIGN PATENT DOCUMENTS

WO   WO 2012/084028 A1   6/2012

*Primary Examiner* — Son Le
*Assistant Examiner* — Dustin Dickinson
(74) *Attorney, Agent, or Firm* — Jenkins, Wilson, Taylor & Hunt, P.A.

(57) ABSTRACT

The present invention relates to a calibration method and a calibration arrangement for a RF test apparatus for testing a RF device under test. Instead, a calibration board is provided and connected to each of the cables of the RF test apparatus. A calibration board is configured to provide a plurality of connection loops by connecting the input/output channel terminals of the test apparatus one after the other with each other. This results to a bunch of different connection loops. Then a physical parameter, such as the attenuation over frequency, is measured for each of these connection loops. Since each physical parameter can be described by a single equation, this results to an amount of different equations which form an equation system. The idea underlying the present invention is that the amount of equations of this equation system, which amount corresponds to the different connection loops, is at least equal or higher than the amount of unknown parameters of the equation system. Consequently, the equation system is overdetermined and—as a consequence of that—mathematically solvable.

27 Claims, 5 Drawing Sheets

(56) References Cited

U.S. PATENT DOCUMENTS

| | | | | |
|---|---|---|---|---|
| 2012/0242357 A1* | 9/2012 | Eccles | ................ | G01R 31/3191 324/750.01 |
| 2013/0158927 A1* | 6/2013 | Hassler | .................. | G01R 27/28 702/85 |
| 2015/0241544 A1* | 8/2015 | Ku | ....................... | G01R 35/005 324/750.02 |

* cited by examiner

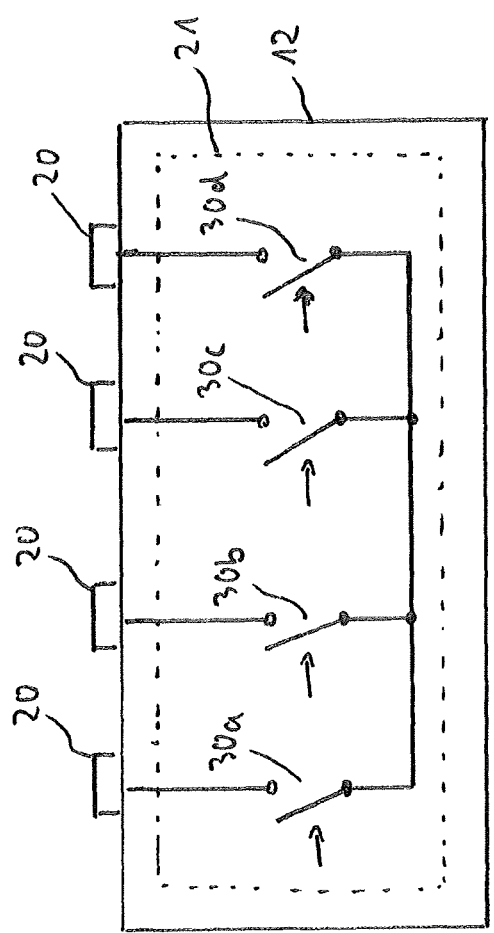

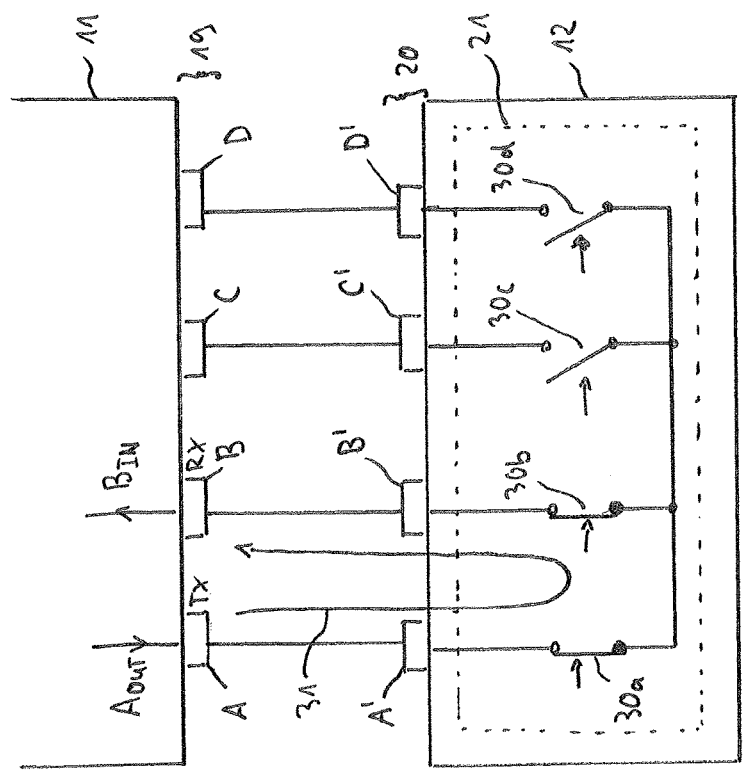

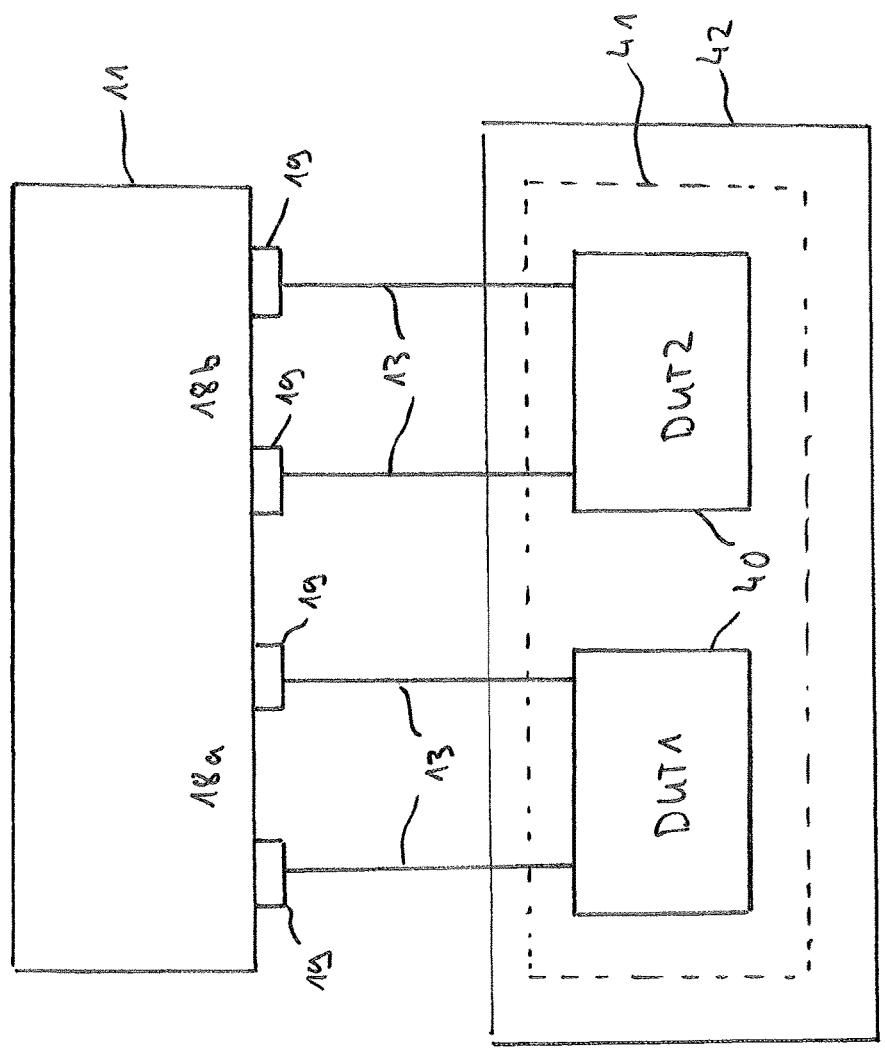

CALIBRATION METHOD AND CALIBRATION ARRANGEMENT

FIELD OF THE INVENTION

The present invention relates to a calibration method and a calibration arrangement for a RF test apparatus for testing a RF device under test.

BACKGROUND OF THE INVENTION

Electronic equipment, such as a mobile communication device or a mobile computing device, is subject to various electronic tests after production. Such tests are generally necessary to ensure proper configuration, calibration and functionality of various elements of the devices under test (DUT). For testing purposes, specific test apparatus are employed which simulate a testing environment under predefined testing conditions. Of particular relevance are tests and test apparatus for electronic equipment which is operated in an environment sensitive to radio frequency (RF) signals. Such equipment may be used to output, receive, measure or otherwise process RF-sensitive parameters and signals.

For the testing, specific cables, such as RF coaxial cables, are connected to channel terminals of the test apparatus. In reality, these cables are different with regard to their physical properties, in particular with regard to their length, electrical resistance, type and the like. Consequently, when using these cables during the testing the resulting attenuation is more or less different, even though cables of the same type and/or the same length are used. For highly sensitive test apparatus, such as RF test apparatus, this is not acceptable since due to the variation of the attenuation the test results are no more reliable. Therefore, modern RF test apparatus have to be calibrated before the testing is started.

WO 2012/084028 A1 discloses a calibration module for a RF test apparatus. The calibration module comprises a mode selector which is configured to switch between a measurement mode and a calibration mode. A separate calibration module is provided for calibration of a RF channel based on measurement signals.

SUMMARY OF THE INVENTION

According to the disclosure of present invention a calibration method and a calibration arrangement for a RF test apparatus for testing a RF device under test may be implemented.

Specifically, according to a first aspect of the invention, a calibration method for a RF test apparatus for testing a RF device under test is provided, the method comprising: providing a RF test apparatus having a plurality of channel terminals, a calibration board having a plurality of board terminals and a first amount of cables, wherein each of the cables is connected with its first end side to one of the channel terminals of the RF test apparatus and with its second end side to one of the board terminals of the calibration board, the calibration board comprising an internal wiring which is comprised of a second amount of connections such to provide a second amount of connection loops between the channel terminals of the RF test apparatus, wherein the second amount is greater-than-or-equal to the first amount; setting up an equation system consisting of a second amount of mathematical equations for calculating the attenuation for each of the second amount of connection loops; measuring the attenuation for each of the second amount of connection loops; measuring the attenuation for each of the second amount of connections on the calibration board; determining a first amount of attenuations of the cables by solving the equation system; providing a path correction prior to starting a test process for every individual cable connected to corresponding channel terminals of the RF test apparatus based on the determined attenuations of the cables.

According to a second aspect of the invention, a calibration arrangement for a RF test apparatus for testing a RF device under test is provided, the arrangement comprising: a RF test apparatus having a plurality of channel terminals, a first amount of cables, wherein each of the cables is connected with its first end side to one of the channel terminals of the RF test apparatus and with its second end side to board terminals of a calibration board, a calibration board having a plurality of board terminals and comprising an connecting circuit which is comprised of a second amount of connections such to provide a second amount of connection loops between the channel terminals of the RF test apparatus, wherein the second amount is greater-than-or-equal to the first amount; a measuring device which is configured to measure the attenuation for each of the second amount of connection loops and to measure the attenuation for each of the second amount of connections on the calibration board; a calibration device which is configured to set up an equation system consisting of a second amount of mathematical equations for calculating the attenuation for each of the second amount of connection loops, to determine a first amount of attenuations of the cables by solving the equation system and to provide a path correction for every individual cable connected to corresponding terminals of the RF test apparatus based on the determined attenuations of the cables.

The present invention is based on the finding that disconnecting the RF cables from the RF test apparatus is not necessary for providing a calibration of the test apparatus. Instead, a calibration board is provided and connected to each of the cables of the RF test apparatus. This calibration board provides a plurality of connection loops by connecting the input/output channel terminals of the test apparatus one after the other with each other. This results to a bunch of different connection loops. Then a physical parameter, such as the attenuation over frequency, is measured for each of these connection loops by means of the test apparatus. Since each physical parameter can be described by a single equation, this results to an amount of different equations which form an equation system.

The idea underlying the present invention is that the amount of equations of this equation system, which amount corresponds to the different connection loops, is at least equal or higher than the amount of unknown parameters of the equation system. Consequently, the equation system is overdetermined and—as a consequence of that—mathematically solvable.

Or in other words: The unknown parameters of the equation system are resulting from the amount of different connection cables. The amount of connection cables is—if the test apparatus comprises three or more input/output channel terminals—less than the amount of connection loops when connecting these input/output channel terminals in any available permutation. This way, by dissolving the overdetermined equation system by means of known mathematical methods it is possible to determine the unknown parameters. These determined unknown parameters correspond to the unknown attenuations of the cables. Upon knowledge of these unknown parameters, i.e. attenuations, it is possible to perform the calibration of the test apparatus.

This method for determining the attenuation of the different cables is based on the assumption that the attenuation effect of a connection of the cable to the test apparatus, i.e. attenuations caused by the test apparatus side male connector of a cable and the corresponding female connector of the test apparatus, is negligible. If this does not apply, a specific unknown parameter, which is determined according to the present invention, refers to the attenuation of a specific cable and the corresponding connection of this cable to the test apparatus (i.e. the test apparatus side male connector of a cable and the corresponding female connector of the test apparatus).

This calibration method according to the present invention may be performed at any time without disconnecting the cables from the test apparatus. This way, a very simple and easy calibration is provided without the need to disconnect the cables from the test apparatus and/or the DUTs.

Specific embodiments of the invention are set forth in the dependent claims.

According to a further aspect, each of the second amount of connection loops comprises two different cables.

According to a further aspect, each mathematical equation of the equation system is assigned to a different connection loop and wherein each one of the connection loops contains two measured attenuations and two unknown attenuations, wherein the two unknown attenuations are assigned to the both cables of the connection loop.

According to a further aspect, a mathematical equation of the equation system has the following pattern: XY=XX'+X'Y'+YY', wherein XY is the measured attenuation of the connection loop between a first channel terminal X and a second channel terminal Y of the RF test apparatus, wherein XX' is an unknown attenuation of a first cable between the first channel terminal X of the RF test apparatus and a first board terminal X' of the calibration board, wherein X'Y' is the measured attenuation of an internal connection of the calibration board between the first board terminal X' and a second board terminal Y' of the calibration board and wherein YY' is an unknown attenuation of a second cable between the second board terminal Y' of the calibration board and the second channel terminal Y of the RF test apparatus.

According to a further aspect, the step of measuring the attenuation for each of the second amount of connection loops or the step of measuring the attenuation for each of the second amount of connections on the calibration board is performed by the RF test apparatus.

According to a further aspect, the first amount is at least 3. In particular the first amount is 4, 6 or 8.

According to a further aspect, the calibration board comprises a controllable switching mechanism for providing the second amount of connection loops between the different board terminals of the calibration board. This way, predefined connection loops are settable.

According to a further aspect, the switching mechanism is controlled by the RF test apparatus.

According to an alternative aspect, the calibration board comprises a second amount of hardwired connections between the different board terminals of the calibration board.

According to a further aspect, the step of measuring the attenuation for each of the second amount of connection loops further comprises: providing a predefined measurement signal to a first channel terminal of a predefined connection loop and measuring a response signal on a second channel terminal of the predefined connection loop.

According to a further aspect, the calibration method is performed automatically before a test process is started or after a predefined amount of test cycles or after switching on a test apparatus or after connecting the cables to the channel terminals. Or in other words: The calibration may be done at any time prior to testing a DUT.

According to a further aspect, the cables are RF coaxial cables, which typically have different length or are of different type and thus show different physical properties such as attenuation and resistance.

According to a further aspect, the calibration arrangement further comprises a signal generator which is configured such to provide a predefined measurement signal to a first channel terminal of a connection loop, wherein the measuring device is configured to measure a response signal on a second channel terminal of the same connection loop. The signal generator is in particular part of the RF test apparatus.

According to a further aspect, at least one of the measuring device and the calculation device is part of the RF test apparatus.

According to a further aspect, the test apparatus comprises the first amount of channels, each of them is assigned to a different channel terminal, wherein at least half of the channels are transmit (TX) channels and at least another half of the channels are receive (RX) channels. According to a further aspect, at least one of the channel is as well a channel transmit and a receive channel, which is consequently configured to as well transmit signals and receive signals.

According to a further aspect, the test apparatus comprises at least 3 channel terminals and wherein the calibration board comprises at least the same amount of board terminals. In particular, the test apparatus comprises 4, 6, or 8 channel terminals and wherein the calibration board comprises at least the same amount of board terminals, or vice versa.

According to a further aspect, the calibration board is part of a test chamber or a test environment for receiving a DUT during testing.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the accompanying drawings. Elements in the drawings are illustrated for simplicity and clarity and have not necessarily been drawn to scale.

FIG. 2 schematically illustrates a first example of a calibration board;

FIG. 3 schematically illustrates a calibration arrangement having a calibration board according to a further aspect of the invention;

FIG. 5 shows a test environment after calibration according to a further aspect of the invention.

In all figures of the drawings elements, features and components which are the same or at least have the same

DETAILED DESCRIPTION OF THE EMBODIMENTS

Figure 1:
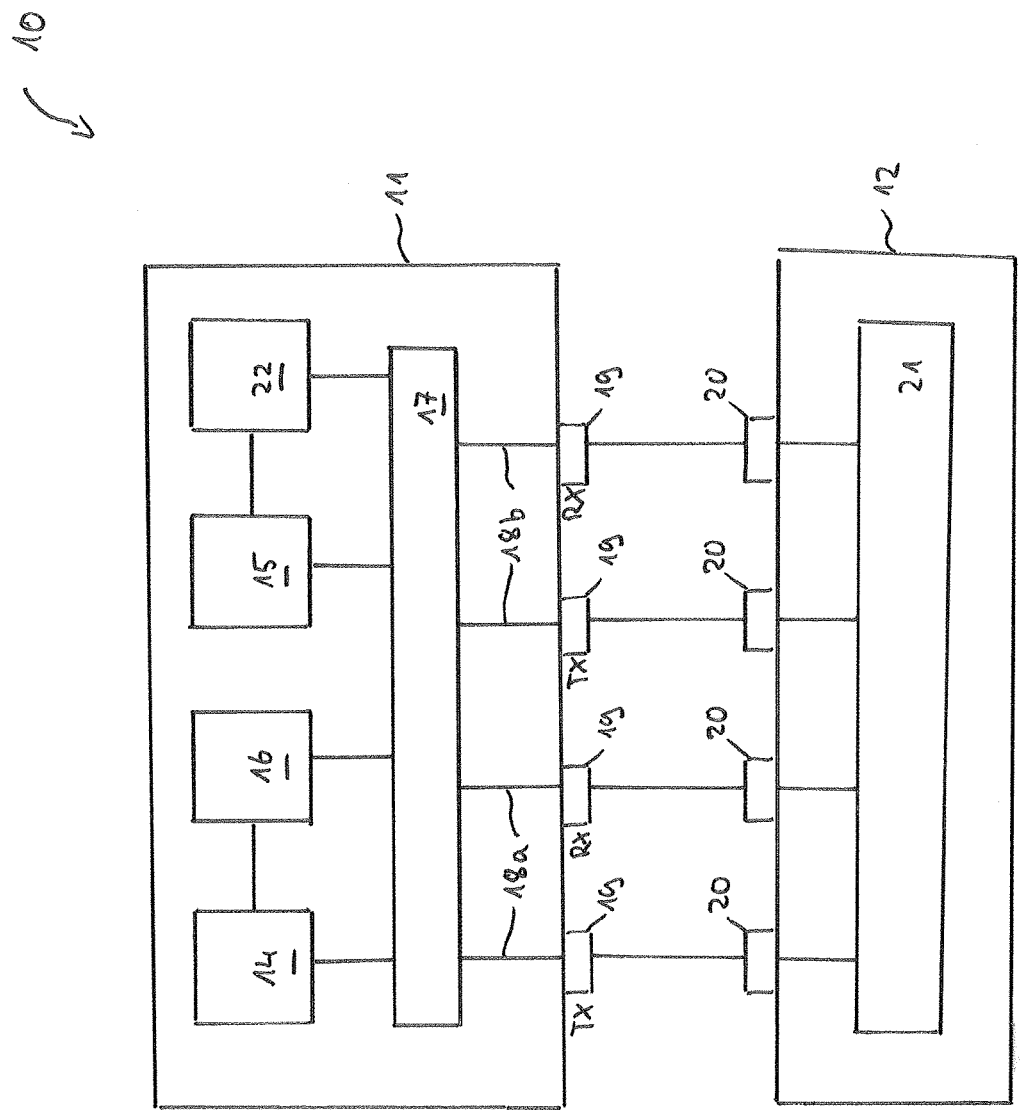
FIG. 1 schematically illustrates a calibration arrangement according to an aspect of the invention.

FIG. 1 schematically illustrates a calibration arrangement for a RF test apparatus for testing a RF device under test. The calibration arrangement 10 comprises a test apparatus 11 and a calibration board 12 and a plurality of RF coaxial cables 13 between the test apparatus 11 and calibration board 12.

In the embodiment of FIG. 1 the test apparatus 11 comprises a test module 14, a measuring device 15, a calibration device 16, an RF channel device 17 and a signal generator 22.

The test module 14 may be employed to perform functional tests and testing routines on one or more DUTs. Specifically, the test module 14 may be used to perform tests for mobile communication or computing devices, such as laptops, notebooks, tablets, smartphones, mobile phones, pagers, PDAs, digital cameras, mobile PCs and similar electronic equipment. Of course, it should be recognized that other non-mobile electronic equipment may be tested as well, such as—but not limited to—industrial field devices, radio communication base stations, video and TV devices, audio devices like loudspeakers and similar.

The channel device 17 comprises in the embodiment of FIG. 1 two RF channels 18a, 18b. Each of the channels 18a, 18b comprises at least one transmit path (TX) and at least one receive path (RX). Each channel 18a, 18b is connected as well to a receive (RX) channel terminal 19 and a transmit (TX) channel terminal 19, such that during testing operation a channel 18a, 18b is able to send and receive measuring signals to or from the channel terminals to the test module 14. The channel device 17 is arranged between the channel terminals 19 and the test module 14.

In an additional embodiment, at least one channel path of the channels 18a, 18b and thus at least one channel terminals 19 is configured to as well send and transmit signals.

The channel device 17 comprises the functionality to send and receive signals via the channels 18a, 18b. This way, the channel device 17 comprises transmit circuitry and receive circuitry (not shown in FIG. 1) for sending signals and receiving signals through the corresponding channels 18a, 18b.

The calibration board 12 comprises a plurality of board terminals 20. The amount of board terminals 20 at least corresponds to the amount of channel terminals 19 of the test apparatus 11. The calibration board 12 comprises an internal connecting circuit 21 which provides several connections between each one of the board terminals 20 to another board terminal 20.

A cable 13 is connected between each one of the board terminals 20 of the calibration board 12 and a corresponding channel terminal 19 of the test apparatus 11. These cables 13 comprise connectors on both end sides of a cable 13 which connector fits into a corresponding connector of the channel terminal 19 and board terminal 20, respectively.

The test apparatus 11 further comprises a measuring device 15. The measuring device 15 is connected to the channel device 17. This measuring device 15 is capable of measuring a physical parameter, such as the attenuation of a received signal. The measurement is made by transmitting a predefined signal via one transmit channel, by receiving a corresponding receive signal through a receive channel and by comparing the two signals with regard to a specific parameter, such as the attenuation.

For this purpose, the test apparatus 11 comprises a signal generator 22. This signal generator 22 generates the predefined signal. The measuring device 15 compares the predefined signal which was transmitted by the signal generator 22 through a transmit channel with a response signal which was received through a corresponding receive channel. By comparing these two signals, it is possible to derive a physical parameter, such as the attenuation. This physical parameter or attenuation, respectively, is then a measure for a connection loop between the transmit channel and the corresponding receive channel. This way, physical parameters or attenuation, respectively, of a plurality of different connection loops can be measured.

The connecting circuit 21 of the calibration board 12 is configured such that during calibration the different cables 13 can be connected to each other such to provide the plurality of different connection loops between the channel terminals 19 of the test apparatus 11.

The measuring device 15 is configured to measure the attenuation for each of these connection loops. In particular, the measuring device 15 is able to measure the influence of a physical parameter, such as the attenuation, affected by the cables 13. The measuring device may also be used to measure the attenuation for each of the connection within the connection circuit 21.

The calibration device 16 is capable of calibrating the test apparatus 11 based on the measured influence of the cables 13 and thus of eliminating the unwanted influence of the cables 13 during testing. In particular, the calibration device 16 is configured to setup an equation system consisting of a second amount of mathematical equations for calculating the attenuation for each of the connection loops. The calibration device 16 is further configured to determine the attenuations of the cables 13 by solving the equation system.

Since the connecting circuit 21 of the calibration board 12 is configured such that each of the channel terminals 19 is connectable to each one of the remaining channel terminals 19 of the test apparatus 11, an amount of mathematical equations may be provided. This amount of equations is greater than the amount of cables 13. Thus, an overdetermined equation system is setup. This overdetermined equation system comprises the second amount of mathematical equations having the first amount of unknown coefficients. The first amount of unknown coefficients corresponds basically to the amount of cables 13 between the channel terminals 19 and the board terminals 20. The second amount of mathematical equations corresponds to all permutations of possible connections of the channel terminals 19 via the connecting circuit 21 to another channel terminal 19. This results to an equation system having less unknown coefficients than equations. This equation system can be easily solved via known mathematical methods.

In the present case, the test apparatus 11 comprises altogether four channels 18a, 18b and consequently four channel terminals 19 which are connected via four cables 13 to corresponding board terminals 20 of the calibration board 12. If each of these channel terminals 19 is connected through the cables 13 and the connecting circuit 21 to another channel terminal 19, this results to six different connection loops. The unknown coefficients are the physical properties of the cables 13. The properties of all connection loops may be measured by means of the measuring device 15 in a way described above. The same applies for the measuring of the physical properties of a connection within the connecting circuit 21. This results to an equation system having six equations and four unknown coefficients, which is mathematically solvable. This way, the attenuations caused by the four cables 13 can be determined.

The functionality of the test module 14, measuring device 15 and calibration device 16 may be implemented within a processing circuit, preferably within the same processing circuit. This processing circuit comprises a programmable device, such as a microprocessor, microcontroller, digital signal processor, embedded processor or the like.

The number of input/output channel terminals 19 of the test apparatus 11 is in principle not limited. However, the number of channel terminals 19 may be four or more, more particularly eight or more. The number of channel terminals 19 and corresponding channels 18a, 18b will determine how many DUTs 40 and/or how many testing routines may be tested in parallel.

FIG. 2 shows a first embodiment of the calibration board 12. The connecting circuit 21 of the calibration board 12 comprises a plurality of switches 30a-30d which are arranged in each channel path. These switches 30a-30d are controllable and configured such that for measuring and calibration always two of the switches 30a-30d are closed and the other two switches 30a-30d are opened. This way, it is possible to establish a connection loop between one channel terminal 19 of the test apparatus 11 through the board terminal 20 and the connecting circuit 21 back to another channel terminal 19 for every measuring and calibration step. After measuring and calibration of this connection loop, the switches 30a-30d are switched such that another connection loop is established. This way, in the embodiment of FIG. 2 altogether six different connection loops may be established one after the other.

Hereinafter, the cannel calibration using a test apparatus 11 and a calibration board 12 is explained on the basis of FIG. 3:

In a first step, a calibration loop 31 is established between the two channel terminals A, B. Here, channel terminal A is assigned to a transmit channel TX and channel terminal B is assigned to a receive channel RX. The connection loop 31 is established by closing the two switches 30a, 30b. The remaining switches 30c, 30d remain opened. This results to the connection loop 31 between the channel terminals A, B.

Hereinafter, in a second step the measuring device 15 measures the attenuation AB over a frequency as follows: $AB = A_{out} - B_{in}$.

In this equation, $A_{out}$ is a signal level of a transmit signal which is provided to the channel terminal A for example by the signal generator 22. $B_{in}$ is a signal level of a response signal received at the channel terminal B which is for example measured by the measuring device 15. $A_{out}$ and $B_{in}$ as well as the measured attenuation AB are vectors.

This results to a first equation of the equation system:

$$AB = AA' + BB' + A'B'$$

In this equation, AB is the attenuation over frequency which is measured such as described above. A'B' is the known attenuation of a connection between the board terminals A'B'. This known attenuation A'B' may also be measured, for example by means of the measuring device 15 of the test apparatus 11. Consequently, the above equation comprises two known parameters, i.e. AB and A'B', and two unknown parameters, i.e. AA', BB'.

Hereinafter, in a further step another connection loop is established by suitable switching the switches 30a-30d of the connecting circuit 21.

This way, altogether six different connection loops 31 may be established. For each one of these connection loops 31, it is possible to measure the attenuation between the corresponding channel terminals 19. This results to the following equation system:

$$AB = AA' + BB' + A'B';$$ Equation 1:

$$AC = AA' + CC' + A'C';$$ Equation 2:

$$AD = AA' + DD' + A'D';$$ Equation 3:

$$BC = BB' + CC' + B'C';$$ Equation 4:

$$BD = BB' + DD' + B'D';$$ Equation 5:

$$CD = CC' + DD' + C'D'.$$ Equation 6:

This equation system comprises altogether six different equations, of which each one is directed to a different connection loop. This results to an amount of six different equations having only four unknown parameters. The unknown parameters are AA', BB', CC', DD'. This results to an overdetermined equation system.

By applying mathematically solving the equation system, the unknown parameters, i.e. the attenuation AA', BB', CC', DD', may be determined. This information of the different attenuations between the channel terminal 19 and the corresponding board terminals 20 caused by the cables 13 may then be used by the calibration device 16 to calibrate the channels 18a, 18b.

Figure 4A:
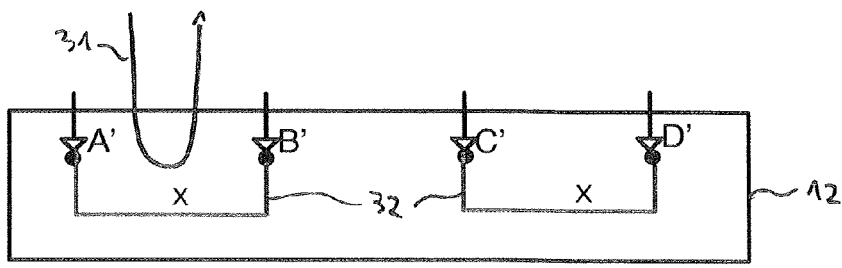
FIGS. 4A-4C schematically illustrates a second example of a calibration board.
Figure 4B:
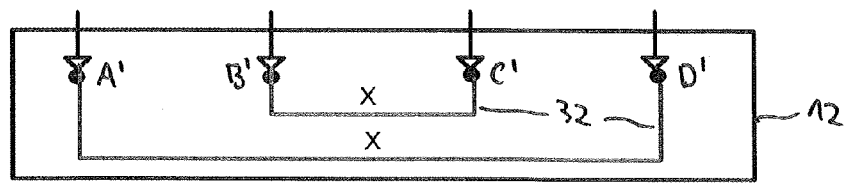
Figure 4C:
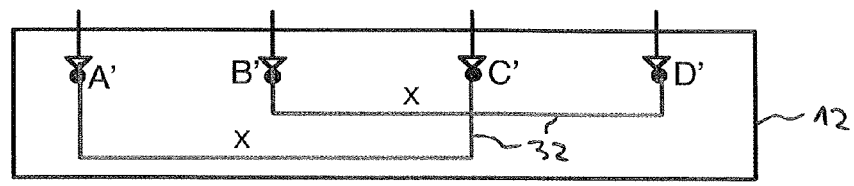

FIG. 4A-4C shows a calibration board according to a second embodiment. This second embodiment of FIG. 4A-4C provides a simpler circuitry design of the calibration board 12. Here, the connecting circuit 21 does not comprise switches, but only hard-wired connections 32 between the different board terminals 20. The six different connections 32 between the four different board terminals A', B', C', D' are shown for the sake of better illustration in the three FIGS. 4A-4C. This results to six different connection loops between the different channel terminals A, B, C, D of the test apparatus 11.

Unlike the first embodiment shown in FIGS. 2 and 3, in the second embodiment FIG. 4A-4C it is assumed that each of the attenuations caused by the different hard-wired connections 32 is unknown. It is further assumed, that this unknown attenuation is the same for all different hard-wired connections 32. This results to the following equation system:

$$AB = AA' + BB' + X;$$ Equation 1:

$$AC = AA' + CC' + X;$$ Equation 2:

$$AD = AA' + DD' + X;$$ Equation 3:

$$BC = BB' + CC' + X;$$ Equation 4:

$$BD = BB' + DD' + X;$$ Equation 5:

$$CD = CC' + DD' + X.$$ Equation 6:

The parameter X refers to the unknown attenuations caused by each one of the hard-wired connection 32. This equation system comprises six independent equations having five unknown parameters. This equation system is overdetermined and may be also solved easily by applying known mathematical methods, too. Solving the equation system results to the unknown parameters AA', BB', CC', DD', X. Then, the calibration device 16 can then use these information of the determined parameters AA', BB', CC', DD', X for calibrating the test apparatus 11 and the corresponding channels 18a, 18b.

After calibration, the calibration board 12 is disconnected from the test apparatus 11 by decoupling the cables 13 from the board terminals 20. The test apparatus 11 is then ready for testing the DUTs.

In another embodiment, the calibration process as being described above with regard to FIGS. 3 and 4A-4C will run automatically and without the need to disconnect the test apparatus 11 from the test environment 42. In particular, the calibration board 12 may even be part of the test environment 42 in which the DUTs 40 are arranged.

FIG. 5 shows a test environment for testing DUTs. The test environment 42 is denoted by reference symbol 42. The test environment 42 comprises at least one test chamber 41 in which in this embodiment two DUT 40 are arranged. The test chamber 41 is connected via several cables 13 to the channel terminals 19. These cables 13 are in the present case semi-flexible RF coaxial cables. The test apparatus 11 comprises two channels 18a, 18b. Each of these channels 18a, 18b is connected to one of the DUTs 40.

The number of DUTs 40 to be tested within the test environment 42 simultaneously or in parallel is in general not limited to any particular number, but will be determined by the properties and facilities of the testing apparatus 11 employed. Generally, it is desirable to test as many DUTs 40 as possible at the same time in order to increase the efficiency of the testing routines and to keep the overall testing time for a batch of DUTs 40 as short as possible.

The testing routine signals may be generated according to the desired testing routine to be performed on one or more of the DUTs 40. The testing routine signals may involve instructions on specific testing signals or testing signal sequences and their respective properties like signal frequency, signal amplitude, signalling strength, pulse duration, pulse rate or similar. The testing signals to be generated on the basis of the testing routine signals may then be generated upon receipt at its testing signal interface.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections between various elements as shown and described with respect to the drawings may be a type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Also, the invention is not limited to physical devices or units implemented in non-programmable hardware, but can also be applied in programmable devices or units able to perform the desired device functions by operating in accordance with suitable program code. Furthermore, the devices may be physically distributed over a number of apparatuses, while functionally operating as a single device. Devices functionally forming separate devices may be integrated in a single physical device. Those skilled in the art will recognize that the boundaries between logic or functional blocks are merely illustrative and that alternative embodiments may merge logic or functional blocks or impose an alternate decomposition of functionality upon various logic or functional blocks.

In the description, any reference signs shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The order of method steps as presented in a claim does not prejudice the order in which the steps may actually be carried, unless specifically recited in the claim.

Skilled artisans will appreciate that the illustrations of chosen elements in the drawings are only used to help to improve the understanding of the functionality and the arrangements of these elements in various embodiments of the present invention. Also, common and well understood elements that are useful or necessary in a commercially feasible embodiment are generally not depicted in the drawings in order to facilitate the understanding of the technical concept of these various embodiments of the present invention. It will further be appreciated that certain procedural stages in the described methods may be described or depicted in a particular order of occurrence while those skilled in the art will understand that such specificity with respect to sequence is not actually required.

LIST OF USED REFERENCE NUMERALS

10 calibration arrangement
11 test apparatus
12 calibration board
13 (RF) cables, coaxial cables
14 test module
15 measuring device
16 calibration device
17 channel device
18a, 18b channels
19 channel terminals
20 board terminals
21 connecting circuit
22 signal generator
30a-30d switches
31 connection loop
32 hard-wired connections
40 device under test, DUT, user equipment
41 calibration chamber
42 test environment
A, B, C, D channel terminals
A', B', C', D' board terminals RX receive terminal/channel
TX transmit terminal/channel
X unknown attenuation

What is claimed is:

1. A calibration method for a radio frequency (RF) test apparatus for testing an RF device under test (DUT), the method comprising:
   providing an RF test apparatus having a plurality of channel terminals, a calibration board having a plurality of board terminals and a first amount of cables, wherein each of the cables is connected with its first end side to one of the channel terminals of the RF test apparatus and with its second end side to one of the board terminals of the calibration board, the calibration board comprising an internal connection circuit for providing a second amount of connections within the calibration board such to provide a second amount of connection loops between the channel terminals of the RF test apparatus, wherein the second amount is greater-than-or-equal to the first amount;
   setting up an equation system for calculating the attenuation for each of the second amount of connection loops;
   measuring the attenuation for each of the second amount of connection loops;
   measuring the attenuation for each of the second amount of connections on the calibration board;
   determining a first amount of attenuations of the cables by solving the equation system; and
   providing a path correction prior to starting a test process for every individual cable connected to corresponding channel terminals of the RF test apparatus based on the determined attenuations of the cables.

2. The method of claim 1, wherein each of the second amount of connection loops comprises two different cables.

3. The method of claim 2, wherein each mathematical equation of the equation system is assigned to a different connection loop and wherein each one of the connection loops contains two measured attenuations and two unknown attenuations, wherein the two unknown attenuations are assigned to the cables of the connection loop.

4. The method of claim 1, wherein a mathematical equation of the equation system has the following pattern:

$$XY = XX' + X'Y' + YY'$$

wherein $XY$ is the measured attenuation of the connection loop between a first channel terminal $X$ and a second channel terminal $Y$ of the RF test apparatus,
   wherein $XX'$ is an unknown attenuation of a first cable between the first channel terminal $X$ of the RF test apparatus and a first board terminal $X'$ of the calibration board, wherein $X'Y'$ is the measured attenuation of an internal connection of the calibration board between the first board terminal $X'$ and a second board terminal $Y'$ of the calibration board, and
   wherein $YY'$ is an unknown attenuation of a second cable between the second board terminal $Y'$ of the calibration board and the second channel terminal $Y$ of the RF test apparatus.

5. The method of claim 1, wherein the step of measuring the attenuation for each of the second amount of connection loops or the step of measuring the attenuation for each of the second amount of connections on the calibration board is performed by the RF test apparatus.

6. The method of claim 1, wherein the first amount is at least 3.

7. The method of claim 6, wherein the first amount is 4, 6 or 8.

8. The method of claim 1, wherein the calibration board comprises a controllable switching mechanism for providing the second amount of connection loops between the different board terminals of the calibration board.

9. The method of claim 8, wherein the switching mechanism is controlled by the RF test apparatus.

10. The method of claim 1, wherein the calibration board comprises a second amount of hardwired connections between the different board terminals of the calibration board.

11. The method of claim 1, wherein the step of measuring the attenuation for each of the second amount of connection loops further comprises:
    providing a predefined measurement signal to a first channel terminal of a predefined connection loop; and
    measuring a response signal on a second channel terminal of the predefined connection loop.

12. The method of claim 1, wherein the calibration method is performed automatically:
    before a test process is started or
    after a predefined amount of test cycles or
    after switching on a test apparatus or
    after connecting the cables to the channel terminals.

13. A calibration arrangement for a radio frequency (RF) test apparatus for testing an RF device under test (DUT), the arrangement comprising:
    an RF test apparatus having a plurality of channel terminals, a first amount of cables, wherein each of the cables is connected with its first end side to one of the channel terminals of the RF test apparatus and with its second end side to board terminals of a calibration board,
    a calibration board having a plurality of board terminals and comprising an connecting circuit for providing a second amount of connections within the calibration board such to provide a second amount of connection loops between the channel terminals of the RF test apparatus, wherein the second amount is greater-than-or-equal to the first amount;
    a measuring device which is configured to measure the attenuation for each of the second amount of connection loops and to measure the attenuation for each of the second amount of connections on the calibration board; and
    a calibration device which is configured to set up an equation system for calculating the attenuation for each of the second amount of connection loops, to determine a first amount of attenuations of the cables by solving the equation system and to provide a path correction for every individual cable connected to corresponding terminals of the RF test apparatus based on the determined attenuations of the cables.

14. The arrangement of claim 13, wherein each of the second amount of connection loops comprises two different cables.

15. The arrangement of claim 13, wherein the calibration device is further configured such that for setting up an equation system each mathematical equation of the equation system is assigned to a different connection loops and that each one of the connection loops contains two measured attenuations and two unknown attenuation, wherein the two unknown attenuations are assigned to the cables of the connection loop.

16. The arrangement of claim 13, wherein the calibration device is further configured such that for setting up an equation system a mathematical equation of the equation system has the following pattern:

$$XY = XX' + X'Y' + YY'$$

wherein XY is the measured attenuation of the connection loop between a first channel terminal X and a second channel terminal Y of the RF test apparatus,
wherein XX' is an unknown attenuation of a first cable between the first channel terminal X of the RF test apparatus and a first board terminal X' of the calibration board,
wherein X'Y' is the measured attenuation of an internal connection of the calibration board between the first board terminal X' and a second board terminal Y' of the calibration board, and
wherein YY' is an unknown attenuation of a second cable between the second board terminal Y' of the calibration board and the second channel terminal Y of the RF test apparatus.

17. The arrangement of claim 13, further comprising a signal generator which is configured such to provide a predefined measurement signal to a first channel terminal of a connection loop, wherein the measuring device is configured to measure a response signal on a second channel terminal of the same connection loop.

18. The arrangement of claim 17, wherein the signal generator is part of the RF test apparatus.

19. The arrangement of claim 13, wherein the calibration board comprises a controllable switching mechanism for internally connecting the board terminals such to provide the second amount of connection loops, further comprising a control device for controlling the controllable switching mechanism.

20. The arrangement of claim 13, wherein the calibration board comprises a second amount of hardwired connections between the different board terminals of the calibration board.

21. The arrangement of claim 13, wherein the cables are RF coaxial cables.

22. The arrangement of claim 13, wherein at least one of the measuring device and the calculation device is part of the RF test apparatus.

23. The arrangement of claim 13, wherein the test apparatus comprises the first amount of channels, each of them is assigned to a different channel terminal, wherein at least half of the channels are transmit (TX) channels and at least another half of the channels are receive (RX) channels.

24. The arrangement of claim 23, wherein at least one of the channel is a transmit and receive channel.

25. The arrangement of claim 13, wherein the test apparatus comprises at least 3 channel terminals and wherein the calibration board comprises at least the same amount of board terminals.

26. The arrangement of claim 13, wherein the test apparatus comprises 4, 6, or 8 channel terminals and wherein the calibration board comprises at least the same amount of board terminals.

27. The arrangement of claim 13, wherein the calibration board is part of a test chamber for receiving a DUT during testing.

\* \* \* \* \*